United States Patent
Donohoe et al.

[11] Patent Number: 6,093,655
[45] Date of Patent: *Jul. 25, 2000

[54] PLASMA ETCHING METHODS

[75] Inventors: Kevin G. Donohoe; Richard L. Stocks, both of Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 09/022,813

[22] Filed: Feb. 12, 1998

[51] Int. Cl.$^7$ .................................................. H01L 21/28
[52] U.S. Cl. .................... 438/717; 438/712; 438/725; 438/743; 156/643; 204/192; 216/67; 216/79; 134/1.2; 134/1.3
[58] Field of Search ..................... 438/712, 717, 438/725, 743; 216/67, 79; 134/1.2, 1.3

[56] References Cited

U.S. PATENT DOCUMENTS

| | | |
|---|---|---|
| 4,397,724 | 8/1983 | Moran ...................... 204/192 |
| 4,436,584 | 3/1984 | Bernacki ................... 156/643 |
| 4,513,021 | 4/1985 | Purdes et al. .............. 427/38 |
| 5,468,686 | 11/1995 | Kawamoto ................ 437/229 |
| 5,514,247 | 5/1996 | Shan et al. ................ 156/643.1 |
| 5,593,540 | 1/1997 | Tomita et al. ............. 156/643.1 |
| 5,626,775 | 5/1997 | Roberts et al. ............ 216/67 |
| 5,644,153 | 7/1997 | Keller ..................... 257/324 |
| 5,679,211 | 10/1997 | Huang .................... 156/643.1 |
| 5,679,215 | 10/1997 | Barnes et al. ............. 156/646.1 |
| 5,681,424 | 10/1997 | Saito et al. ............... 156/643.1 |
| 5,716,494 | 2/1998 | Imai ...................... 156/643.1 |
| 5,756,400 | 5/1998 | Ye et al. .................. 438/710 |
| 5,780,338 | 7/1998 | Jeng et al. ............... 438/253 |
| 5,788,869 | 8/1998 | Dalton et al. ............. 216/60 |
| 5,817,578 | 10/1998 | Ogawa .................... 438/714 |
| 5,830,279 | 11/1998 | Hackenberg .............. 134/1.1 |
| 5,843,239 | 12/1998 | Shrotriya ................. 134/1.1 |
| 5,868,853 | 2/1999 | Chen et al. ............... 134/1.1 |
| 5,873,948 | 2/1999 | Kim ....................... 134/19 |
| 5,879,575 | 3/1999 | Tepman et al. ............ 216/68 |
| 5,950,092 | 9/1999 | Figura et al. ............. 438/399 |
| 9,046,835 | 10/1997 | Figura et al. . |
| 9,080,656 | 5/1998 | Allen, III . |
| 9,141,775 | 8/1998 | Blalock et al. . |

OTHER PUBLICATIONS

Product Bulletin, "TCP™ 9100 High–Density Oxide Etch System Productivity Solution For Advanced Oxide Etch", Lam Research Corporation, Fremont, CA, 9 pages (Nov. 04, 1997 or earlier).

*Primary Examiner*—Maria Nuzzolillo
*Assistant Examiner*—Mark Ruthkosky
*Attorney, Agent, or Firm*—Wells, St. John, Roberts, Gregory & Matkin, P.S.

[57] ABSTRACT

A plasma etching method includes forming polymer material over at least some internal surfaces of a plasma etch chamber and forming polymer material over at least some surfaces of a semiconductor wafer received within the plasma etch chamber. Substantially all polymer material is plasma etched from the chamber internal surfaces while at least some polymer material remains on the wafer. In another aspect, a semiconductor wafer is positioned on a wafer receiver within a plasma etch chamber. A photoresist layer has previously been formed thereon and has openings formed therethrough. First plasma etching is conducted through openings formed in the photoresist layer with a gas comprising carbon and a halogen to form openings in material on the wafer. A first polymer comprising carbon and the halogen forms over at least some internal surfaces of the plasma etch chamber during the first plasma etching. A second polymer is formed over the wafer and relative to the material openings to mask said material within the openings. After forming the first and second polymers and with the wafer in the chamber, substantially all the first polymer from chamber internal surfaces is plasma etched while the second polymer masks the material within the openings.

10 Claims, 4 Drawing Sheets

6,093,655

PLASMA ETCHING METHODS

TECHNICAL FIELD

This invention relates to plasma etching methods.

BACKGROUND OF THE INVENTION

Plasma etchers are commonly used in semiconductor wafer processing for fabrication of contact openings through insulating layers. A photoresist layer having contact opening patterns formed therethrough so is typically formed over an insulative oxide layer, such as $SiO_2$ and doped $SiO_2$. An oxide etching gas, for example $CF_4$, is provided within the etcher and a plasma generated therefrom over the wafer or wafers being processed. The etching gas chemistry in combination with the plasma is ideally chosen to be highly selective to etch the insulating material through the photoresist openings in a highly anisotropic manner without appreciably etching the photoresist itself. A greater degree of anisotropy is typically obtained with such dry plasma etchings of contact openings than would otherwise occur with wet etching techniques.

One type of plasma etcher includes inductively coupled etching reactors. Such typically include an inductive plasma generating source coiled about or at the top of the reactor chamber and an electrostatic chuck within the chamber atop which one or more wafers being processed lies. The electrostatic chuck can be selectively biased as determined by the operator. Unfortunately when utilizing etching components having both carbon and fluorine, particularly in inductively coupled etching reactors, a polymer develops over much of the internal reactor sidewall surfaces. This polymer is electrically insulative and continually grows in thickness during the wafer etching process. In addition, the polymer can react with species in the plasma and cause process results to vary as the polymer thickness changes. For an etch 2 microns deep on the wafer, the polymer thickness on certain internal reactor surfaces can be 3000 Angstroms to 6000 Angstroms. It is highly desirable to remove this polymer because it can make process results vary and can contribute to particle contamination of the wafer(s) being processed.

The typical prior art process for cleaning this polymer material from the reactor employs a plasma etch utilizing $O_2$ as the etching gas. It is desirable that this clean occur at the conclusion of etching of the wafer while the wafer or wafers remain in situ within the reactor chamber. This both protects the electrostatic chuck (which is sensitive to particulate contamination) during the clean etch, and also maximizes throughput of the wafers being processed. An added benefit is obtained in that the oxygen plasma generated during the clean also has the effect of stripping the photoresist from over the previously etched wafer.

One prior art plasma clean is conducted in three steps when using a LAM 9100 type inductively coupled plasma etcher. In a first plasma cleaning step, top electrode power is provided at 600 Watts and the bottom at 200 Watts. $O_2$ feed is provided at 750 sccm for 15 seconds, with pressure being maintained at 15 mTorr. In the second step, top power is at 1750 Watts, bottom electrode is not biased (0 Watts), and $O_2$ feed is provided at 500 sccm for 20 seconds with pressure being maintained at 80 mTorr. In a third step, the pins of the electrostatic chuck are raised to lift the wafer(s), and the top power is provided at 1200 Watts, bottom electrode is not biased (0 Watts), and $O_2$ feed is provided at 500 sccm for 15 seconds with pressure being maintained at 80 mTorr.

However in the process of doing reactor clean etches, there is an approximate 0.025 micron or greater loss in the lateral direction of the contact. In other words, the contact openings within the insulating layer are effectively widened from the opening dimensions as initially formed. This results in an inherent increase in the critical dimension of the circuitry design. As contact openings become smaller, it is not expected that the photolithography processing will be able to adjust in further increments of size to compensate for this critical dimension loss.

Accordingly, it would be desirable to develop plasma etching methods which can be used to minimize critical dimension loss of contact openings, and/or achieve suitable reactor cleaning to remove the polymer from the internal surfaces of the etching chamber. Although the invention was motivated from this perspective, the artisan will appreciate other possible uses, with the invention only be limited by the accompanying claims appropriately interpreted in accordance with the Doctrine of Equivalents.

SUMMARY OF THE INVENTION

In but one aspect of the invention, a plasma etching method includes forming polymer material over at least some internal surfaces of a plasma etch chamber and forming polymer material over at least some surfaces of a semiconductor wafer received within the plasma etch chamber. Substantially all polymer material is plasma etched from the chamber internal surfaces while at least some polymer material remains on the wafer.

In another implementation, a semiconductor wafer is positioned on a wafer receiver within a plasma etch chamber. A photoresist layer has previously been formed thereon and has openings formed therethrough. First plasma etching is conducted through openings formed in the photoresist layer with a gas comprising carbon and a halogen to form openings in material on the wafer. A first polymer comprising carbon and the halogen forms over at least some internal surfaces of the plasma etch chamber during the first plasma etching. A second polymer is formed over the wafer and relative to the material openings to mask said material within the openings. After forming the first and second polymers and with the wafer in the chamber, substantially all the first polymer from chamber internal surfaces is plasma etched while the second polymer masks the material within the openings.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

It has been discovered that the polymer deposited on the internal walls of the etching chamber includes a significant concentration of fluorine. It has been recognized that the oxygen during the clean etching under plasma condition combines with the carbon and fluorine of the polymer liberated from the internal walls and forms carbon monoxide and carbon dioxide plus an activated or reactive fluorine containing species. Unfortunately, this fluorine containing species is also apparently reactive with the silicon dioxide material on the wafer, which is believed to result in more etching of such material and the widening of the contact openings.

Some of this polymer also gets deposited on the wafer during the etch. The polymer can deposit over the sidewalls within the etched openings to a thickness of about 200 Angstroms, being thicker over central portions of the sidewalls than at the base or top of the etched openings. The polymer can also deposit on the bottom of the contact during the overetch. Polymer thicknesses of up to 1500 Angstroms have been observed on the bottom of the contact. Presence of this polymer within the contact openings and its removal during subsequent oxide clean etching can also contribute to critical dimension loss. It has, however, been determined that polymer presence over the internal reactor surfaces is a greater contributing factor to critical dimension loss than polymer presence within the contact openings.

Figure 1:
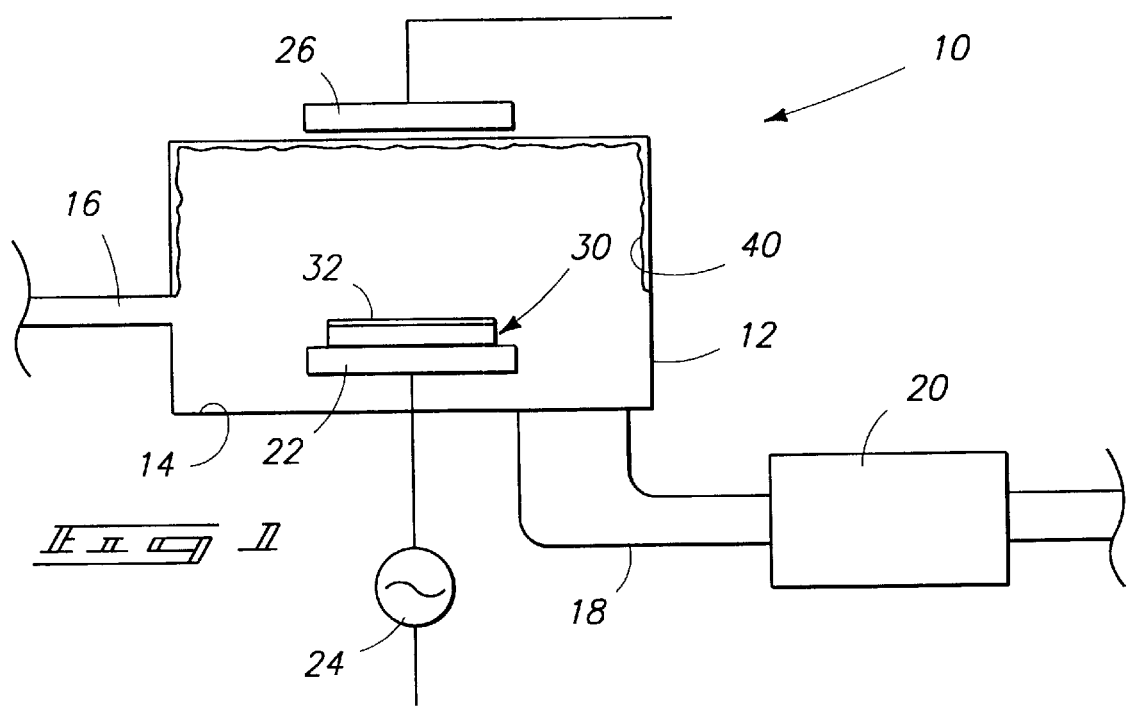
FIG. 1 is a diagrammatic view of a plasma etcher utilized at one processing step in accordance with the invention.

Referring to FIG. 1, a plasma etching reactor is indicated generally with references numeral 10. Such includes a chamber 12 having internal surfaces 14. One or more gas inlets 16 and one or more gas outlets 18 are provided relative to etching chamber 12. A pump 20 is associated with outlet 18 for exhausting and establishing desired sub-atmospheric pressure conditions within chamber 12 during processing.

Plasma etching reactor 10 in the described embodiment is configured as an inductively coupled plasma etcher having a wafer receiver 22 within chamber 12 in the form of an electrostatic chuck. A biasing source 24 is electrically coupled with receiver 22. An inductive plasma inducing source 26 is diagrammatically shown externally at the top of chamber 12.

Figure 2:
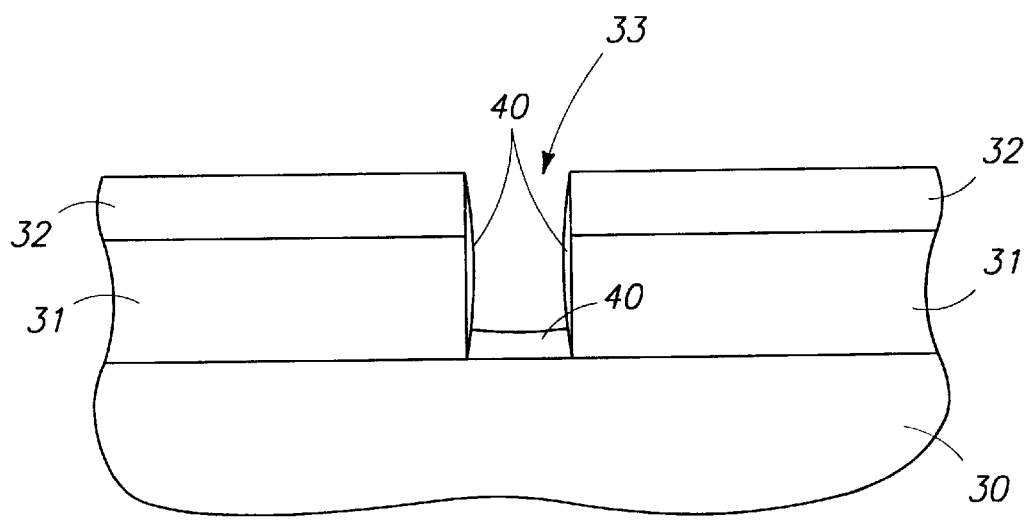
FIG. 2 is an enlarged view of a fragment of a wafer during processing within the plasma etcher of FIG. 1.

In accordance with the preferred embodiment, a semiconductor wafer 30 is positioned upon wafer receiver 22 within chamber 12. Wafer 30 has previously been processed to have a photoresist layer 32 formed on an insulative oxide layer 31 (FIG. 2) formed on the outer surface of wafer 30. Photoresist layer 32 has contact opening patterns formed therethrough which ideally outwardly expose selected portions of underlying insulative oxide layer 31. A desired vacuum pressure is established and maintained within chamber 12 utilizing vacuum pump 20. An example chamber pressure is from about 2 mTorr to about 200 mTorr. Inductively coupled source 26 and chuck 22 are appropriately biased to enable establishment of a desired plasma within and immediately over wafer 30. An example power range for inductively coupled source 26 is from 100 watts to about 2000 watts, with wafer receiver 22 being negatively biased to an example of −200 to −600 Watts. Receiver 22 can have a temperature which is allowed to float, or otherwise be established and maintained at some range, for example from about 0° C. to about 40° C.

Desired etching gases are injected to within chamber 12 through inlet 16, or other inlets, to provide a desired etching gas from which an etching plasma is formed immediately over wafer 30. Such gas can comprise, for example, carbon and a halogen. An exemplary gas would be $CF_4$. Etching is conducted for a selected time to etch desired contact openings, with one such opening 33 being shown in FIG. 2, within insulative oxide material 31 on semiconductor wafer 30 through the contact opening patterns formed within the photoresist layer 32. Unfortunately, a polymer layer 40 comprising carbon and the halogen, and in this example fluorine, forms over some of internal surfaces 14 of plasma etching chamber 12 during such etching. Such polymer can also form on the top of photoresist layer 32 (not specifically shown), with some polymer material 40 also forming over sidewalls within, and at the base of, contact openings 33.

Such provides but one example of forming polymer material, alternately referred to as a first polymer, comprising carbon and a halogen over at least some internal surfaces of a plasma etch chamber. Where a 2 micron deep contact opening is being etched within insulative material 31, an exemplary average thickness of polymer material 40 formed over internal surfaces 14 is 3000 Angstroms. An exemplary maximum thickness of layer 40 formed within contact openings 33 is 200 Angstroms. An exemplary maximum thickness of the polymer deposition on the bottom of the contact is 1000 Angstroms. Thus, a thicker layer of the first polymer forms over internal surfaces of the chamber than over the semiconductor wafer.

Figure 3:
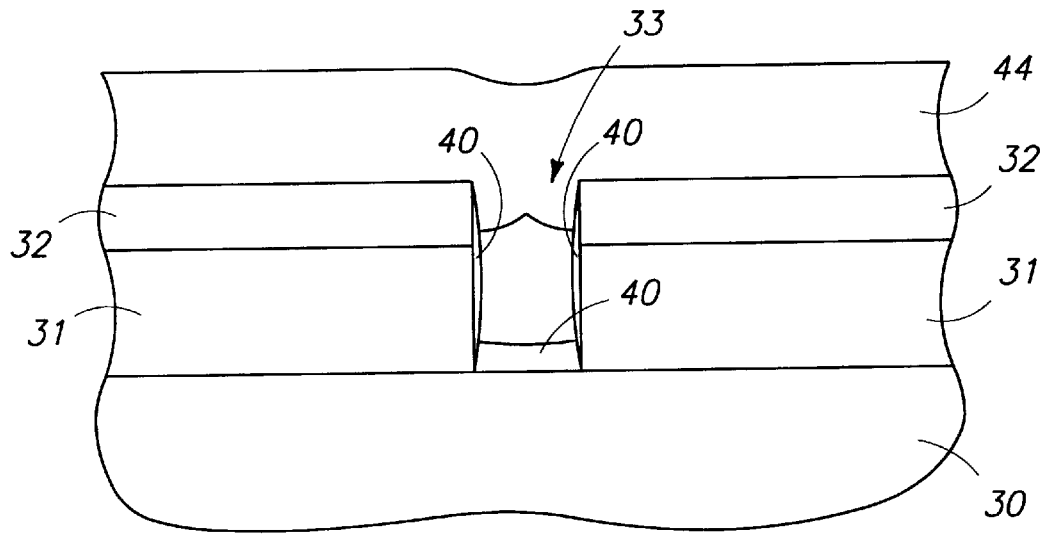
FIG. 3 is a view of the FIG. 2 wafer at a processing step subsequent to that depicted by FIG. 2.

Referring to FIG. 3, a second polymer 44 is formed over first polymer 40 over the wafer and relative to material opening 33 to mask material 31 within opening 33. In the illustrated example, second polymer layer 44 is formed to bridge across opening 33 and less than completely fill openings 33. Second polymer layer 44 is formed to a greater thickness over wafer 30 than any thickness of the second polymer which forms over internal surfaces 14 of chamber 12. Specifically, plasma etching chamber 12 can be utilized to deposit polymer material, for example, when using the same etching gases by biasing electrostatic chuck 22 at 0 Watts during gas feed. In such instances, almost no second polymer material forms on internal surfaces 14 of chamber 12, with deposition of second polymer material being essentially selective to the wafer. As biasing power would be applied and increased relative to wafer receiver 22, second polymer material would begin to deposit over internal surfaces 14 of chamber 12 as a function of increasing bias. Regardless, most preferably the step of forming a second polymer forms such material to a thickness of from 0 Angstroms to no greater than about 100 Angstroms on the internal surfaces 14 of chamber 12. A preferred thickness for layer 44 on wafer 30 is greater than or equal to about 3000 Angstroms.

First and second polymer materials 40 and 44 can comprise the same substantial material, or substantially different materials. Where the etching gases and deposition gases are the same, with different biasing power being provided on the wafer receiver, the polymer materials of layers 40 and 44 comprise similar fluorocarbon polymers. When constituting similar materials, or materials having essentially the same etching rate in a subsequent etching step, the thickness of polymer layer 44 is ideally provided to be greater than the average thickness of all polymer material formed over internal surfaces 14. This allows or enables the polymer to be substantially removed from surfaces 14 before the polymer on the wafer is removed. Where second polymer layer 44 is formed to not contain any fluorine, a possible advantage may be obtained in there being no available flouring in the final layer 44 strip to potentially widen the contact openings. An example would be a hydrocarbon polymer.

Figure 4:
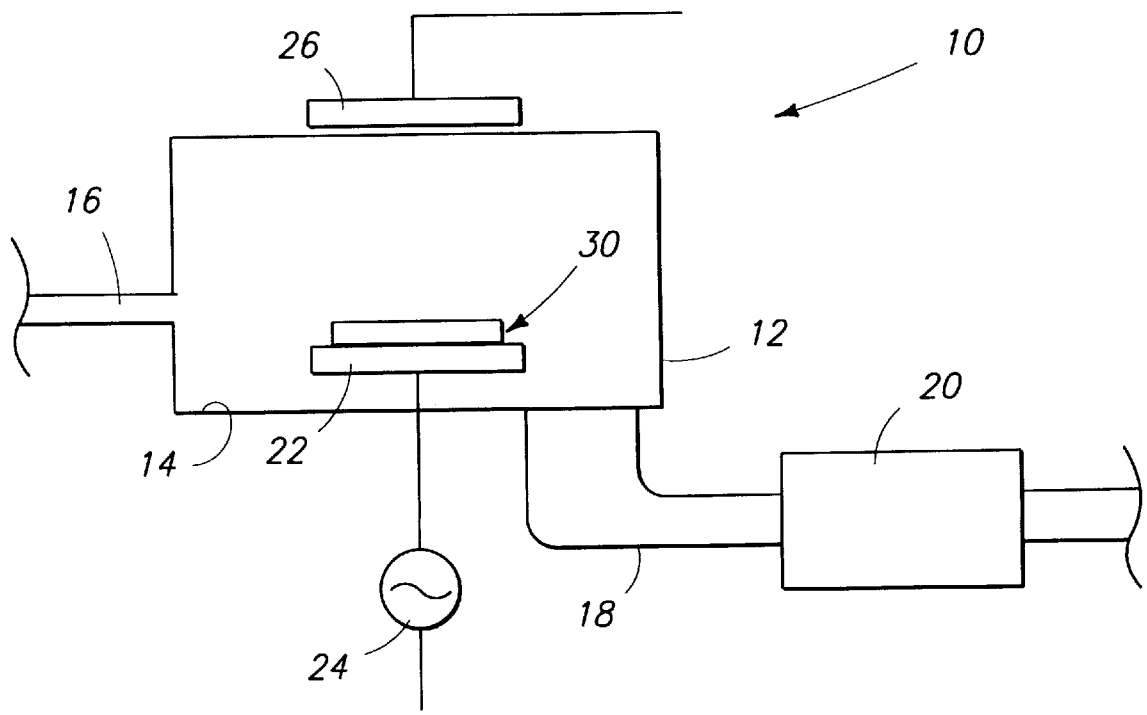
FIG. 4 is a view of the FIG. 1 apparatus and wafer at a processing step subsequent to that depicted by FIGS. 1 and 3.
Figure 5:
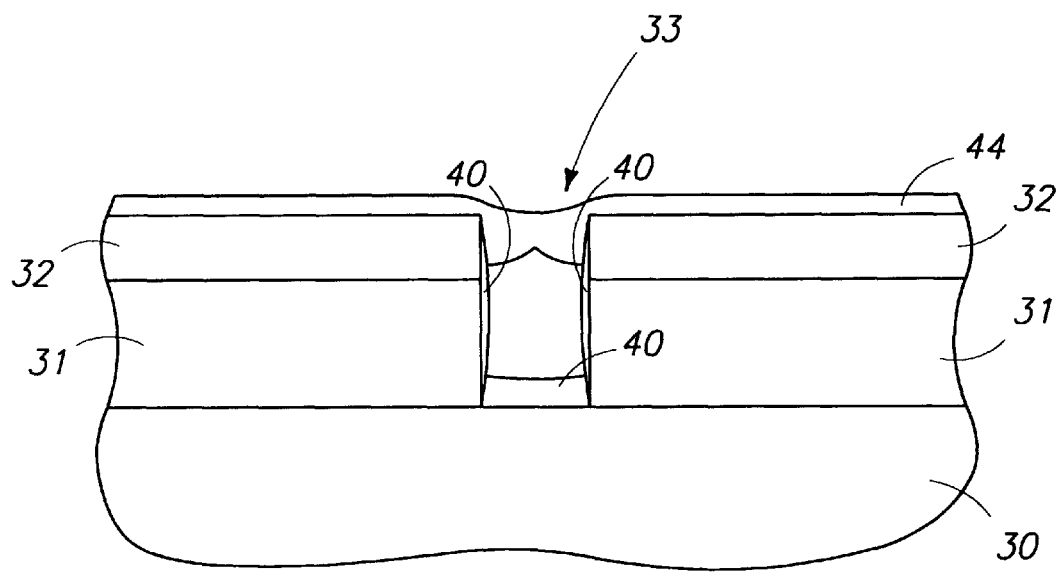
FIG. 5 is a view of the FIG. 2 wafer at a processing step subsequent to that depicted by FIG. 3.

Referring to FIGS. 4 and 5, substantially all polymer material 40/44 is plasma etched from chamber internal surfaces 14 while at least some polymer material 40/44 remains over wafer 30, ideally over and within contact opening 33 to mask material 31 within openings 33 to prevent such openings from widening during the chamber clean etching.

Figure 6:
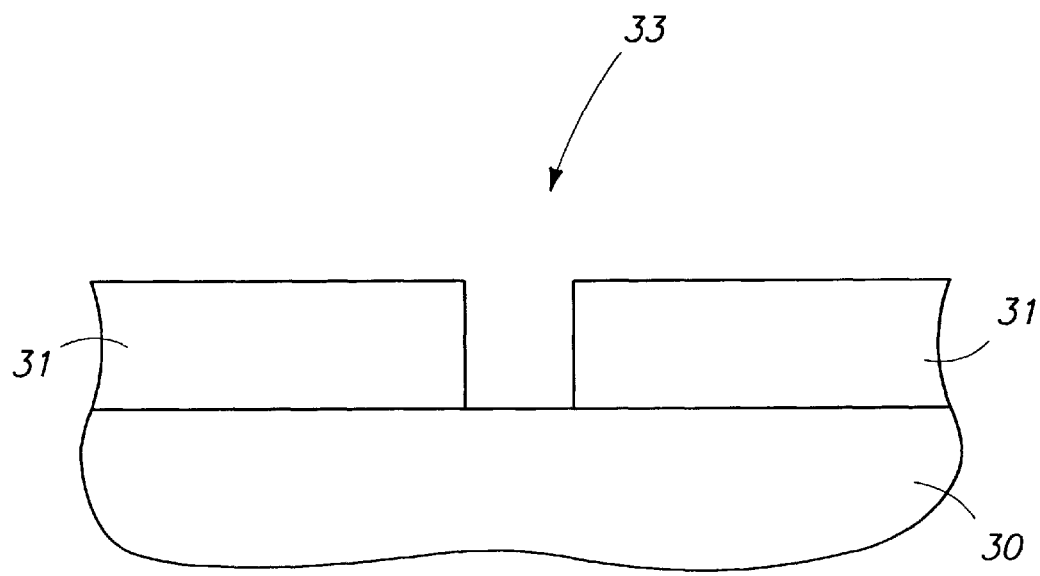
FIG. 6 is a view of the FIG. 2 wafer at a processing step subsequent to that depicted by FIG. 5.

Referring to FIG. 6, further clean etching is ideally conducted to remove all remaining polymer material of layer(s) 44/40 from within contact opening 33, and also to remove any remaining photoresist.

Preferably, the plasma etching of substantially all the first polymer from chamber internal surfaces is conducted in at least four steps comprising at least two different magnitudes of power. An example etching reactor 10 is an LAM 9100 TCP Etcher. An exemplary preferred first step using such a reactor is to provide zero bias on the wafer receiver and 500 watts from the inductive source. Preferred etching gas flow rate is 750 sccm of $O_2$ for 15 seconds at a pressure of 15 mTorr, with Capacitor 4 of the reactor being held at minimum value (approximately 100 pf in the LAM 9100 TCP Etcher). In a second step, all conditions are ideally maintained as with the first step with Capacitor 4 being held at 150 pf. A third step is then conducted under the same conditions, except with Capacitor 4 being held at a 190 pf. These three steps effectively provide a good clean of the internal reactor surfaces, with the low power being preferred to remove the polymer slowly in a manner which does not remove polymer from the wafer at a rate greater than that being removed from the internal surfaces of the chamber.

A preferred fourth step is then to increase power to 1750 watts on the inductive source, while still providing zero voltage bias on the receiver. An exemplary flow rate during such etching is 500 sccm for $O_2$ for 15 seconds at a pressure of 80 mTorr. Capacitor 4 is preferably kept at 100 pf. This etching step is intended to finish the chamber clean. A fifth step is then preferably conducted the same as the fourth, except with Capacitor 4 being set to 150 pf. A preferred final etching step is then conducted at a top inductive power of 500 watts, with the wafer receiver being biased at 250 Watts. $O_2$ flow is preferably 750 sccm for 10 seconds with pressure being maintained at 15 mTorr. Capacitor 4 is set to 150 pf. Such preferred etching is believed to finally clean out any remnant polymer from within the contacts. With such preferred processing with a LAM 9100 TCP Etcher, a power setting with capacitor 4 at a maximum provides greater cleaning at the center of the chamber. A minimum capacitor setting provides greater cleaning towards the outer portions of the chamber. A balanced power setting for capacitor 4 (i.e., 150 pf) provides greater removal in between the outer and inner portions of the chamber.

Figure 7:
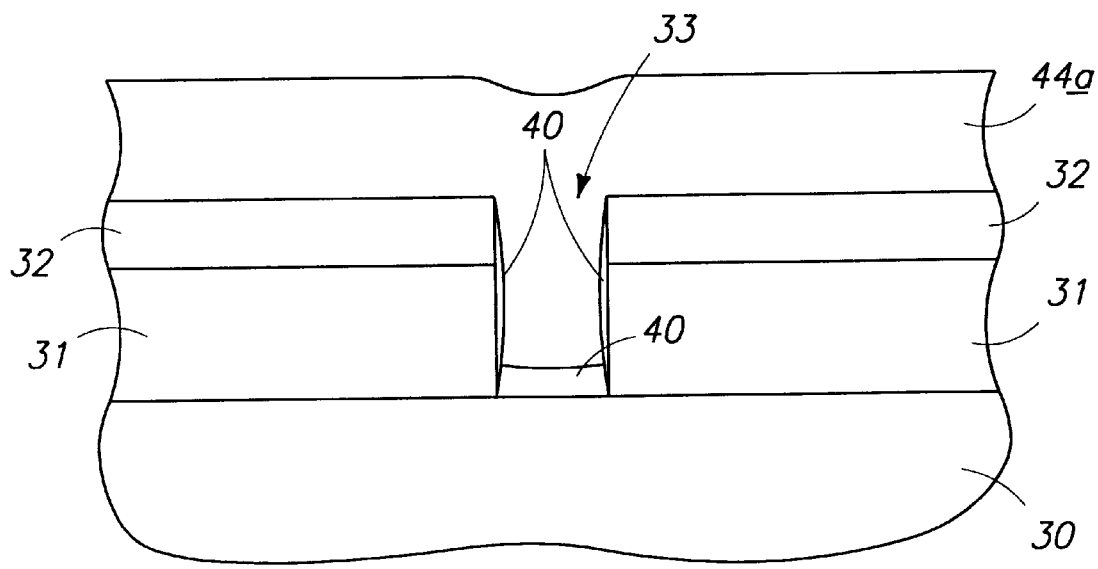
FIG. 7 is a view of a fragment of a wafer during processing within the plasma etch of FIG. 1 and is an alternate to that depicted by FIG. 3.

FIG. 7 illustrates an alternate embodiment relative to that depicted by FIG. 3, whereby second polymer layer 44a is deposited to completely fill contact opening 33. Alternately but less preferred, the second deposited polymer layer could be conformal to less than completely fill contact openings 33 and not bridge such contact openings shut.

Where the first and second (or additional) polymers are substantially different from one another in etch rate, selectivity in the polymer etching can be used substantially independent of total polymer thickness between that on the chamber walls and that on the wafer.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A plasma etching method comprising:

forming polymer material over at least some internal surfaces of a plasma etch chamber and forming polymer material over at least some surfaces of a semiconductor wafer received within the plasma etch chamber; and plasma etching substantially all polymer material from the chamber internal surfaces while at least some polymer material remains on the wafer.

2. The plasma etching method of claim 1 wherein all polymer material formed over the internal surfaces has an average first thickness and all polymer material formed over the wafer has an average second thickness, the average second thickness being greater than the average first thickness.

3. The plasma etching method of claim 1 wherein all polymer material formed over the internal surfaces has an average first thickness and all polymer material formed over the wafer has an average second thickness, the average second thickness being substantially the same as the average first thickness.

4. A plasma etching method comprising:

forming a first polymer over at least some internal surfaces of a plasma etch chamber and forming a second polymer over at least some surfaces of a semiconductor wafer received within the plasma etch chamber; and after forming the first and second polymers and with the wafer in the chamber, plasma etching substantially all the first polymer from chamber internal surfaces while at least some first or second polymer remains on the wafer.

5. The plasma etching method of claim 4 wherein at least one of the first and second polymers comprises carbon and a halogen.

6. The plasma etching method of claim 4 wherein both of the first and second polymers comprises carbon and a halogen.

7. The plasma etching method of claim 4 wherein both polymers comprise fluorine.

8. The plasma etching method of claim 4 wherein the first polymer is formed with a fluorine comprising feed gas and the second polymer is not formed with a fluorine comprising feed gas.

9. The plasma etching method of claim 4 wherein all polymer material formed over the internal surfaces has an average first thickness and all polymer material formed over the wafer has an average second thickness, the average second thickness being greater than or equal to the average first thickness.

10. The plasma etching method of claim 4 wherein all polymer material formed over the internal surfaces has an average first thickness and all polymer material formed over the wafer has an average second thickness, the average second thickness being substantially the same as the average first thickness.

* * * * *

UNITED STATES PATENT AND TRADEMARK OFFICE
CERTIFICATE OF CORRECTION

PATENT NO. : 6,093,655
DATED : July 25, 2000
INVENTOR(S) : Donohoe et al

It is certified that error appears in the above-identified patent and that said Letters Patent is hereby corrected as shown below:

Column 6,
Line 14, please add "after said formings and with the wafer within the chamber".

Signed and Sealed this

Fourth Day of September, 2001

Attest:

*Nicholas P. Godici*

NICHOLAS P. GODICI
*Attesting Officer*    *Acting Director of the United States Patent and Trademark Office*